(12) United States Patent
Ruettiger

(10) Patent No.: US 7,719,402 B2
(45) Date of Patent: May 18, 2010

(54) POTENTIOMETER DIAGNOSIS

(75) Inventor: Anton Ruettiger, Wildflecken (DE)

(73) Assignee: PREH GmbH (DE)

( * ) Notice: Subject to any disclaimer, the term of this patent is extended or adjusted under 35 U.S.C. 154(b) by 420 days.

(21) Appl. No.: 11/330,228

(22) Filed: Jan. 12, 2006

(65) Prior Publication Data

US 2006/0139143 A1    Jun. 29, 2006

Related U.S. Application Data

(63) Continuation of application No. PCT/EP2004/007086, filed on Jun. 30, 2004.

(30) Foreign Application Priority Data

Jul. 12, 2003   (DE) ............................... 103 31 628

(51) Int. Cl.
*H01C 10/30*   (2006.01)
(52) U.S. Cl. .................................. 338/160; 324/714
(58) Field of Classification Search .................. 338/160
See application file for complete search history.

(56) References Cited

U.S. PATENT DOCUMENTS

| | | | |
|---|---|---|---|
| 6,184,695 B1 | 2/2001 | Glaser et al. | |
| 6,809,531 B2 * | 10/2004 | Slye et al. | 324/714 |
| 2002/0024415 A1 * | 2/2002 | Miura | 338/160 |

FOREIGN PATENT DOCUMENTS

| | | |
|---|---|---|
| DE | 35 22 775 A1 | 1/1987 |
| DE | 197 38 050 A1 | 3/1999 |
| DE | 197 51 556 C1 | 6/1999 |
| DE | 198 12 839 A1 | 9/1999 |
| DE | 199 55 461 A1 | 5/2001 |
| DE | 101 59 258 A1 | 6/2003 |
| EP | 0 354 269 | 2/1990 |

* cited by examiner

*Primary Examiner*—Elvin G Enad
*Assistant Examiner*—Joselito Baisa
(74) *Attorney, Agent, or Firm*—Cantor Colburn LLP

(57) ABSTRACT

A diagnostic circuit for a potentiometer that connects a load resistor (laboratory resistor) to the slider of the potentiometer to allow a constant comparison of the contact resistance to measured values in the loaded and/or unloaded state when the slider is being adjusted, or when it is being paused at a critical point. This is accomplished by connecting a pull-up resistor to an input of the microprocessor, to which a load resistor is connected, and which is electrically connected to the slider. The slider itself is connected to an additional input of the microprocessor.

8 Claims, 1 Drawing Sheet

POTENTIOMETER DIAGNOSIS

This nonprovisional application is a continuation of PCT/EP2004/007086, which was filed on Jun. 30, 2004, which claims priority to German Patent Application No. DE 10331628, which was filed in Germany on Jul. 12, 2003, and which are both herein incorporated by reference.

BACKGROUND OF THE INVENTION

1. Field of the Invention

The present invention relates to a diagnosis circuit for a potentiometer, particularly in the areas of a potentiometer, where undefined states occur.

2. Description of the Background Art

Potentiometers are known to have, among other things, a carbon track (resistance track), along which a slider is guided to pick up a signal, and the track thereby has a track beginning and a track end, and thus has an area, over which, in the case of a single-turn potentiometer, the slider moves. When the slider makes contact with the carbon track, a defined contact resistance occurs which can be described as a linear curve. Only at the end of the path, or the beginning of the path does the contact resistance occasionally deviate to substantially higher values due to a minimal contact to the substrate. This increased contact resistance results in indefinable voltage values at the leap from start to end values at the transition point (blind spot). Practical experience has shown that in a subsequent AD (digital and analogous) transducer, an averaged value is registered, which the software interprets as a normal value, and which can deviate considerably. For this reason, for example, no unequivocal reading of a set value can be defined, which changes the reading at random. Frequently, this area is therefore circuit-technically masked out and is not utilized, or is positioned between two stop positions.

In DE 199 55 461 A1, a potentiometer of this class is described, which, together with a servomotor, is used as a servo device for a powered operation of baffles etc., for example. It is mentioned in the description that a small rotational angle of approximately 4 to 8 degrees, which occurs in single-turn potentiometers, is compensated for by electronics. However, no further details are provided.

From DE 197 38 050 A1, a circuit for generating and evaluating the measurement signals of a position sensor is known to identify errors which occur because the contact resistance between the resistor core and the pickup frequently changes in an undefined manner to a relatively large degree. The position sensor, essentially an adjustable resistor, is operated at a constant current to obtain a useful signal and a test or plausibility signal. For this purpose, the partial voltages caused by the partial resistances of the position sensor and the contact resistance between the pickup and the resistor core are registered, from which a useful signal, which depends on the position of the pickup, but which is unaffected by the contact resistance, as well as a test signal that is dependent from the contact resistance, is generated. That is, the supply currents of the potentiometer are utilized in the evaluation.

EP 0 354 269 B1 discloses a circuit arrangement for monitoring the contact resistance of a potentiometer serving as a position transmitter. Based on the fact that contact resistances can form between the resistance track and the slider moving thereupon, which alter the original assignment of slider position and voltage level, an increase in the contact resistance is already registered when a safety-critical level has not been reached yet. In a control device, a current sensing resistor, among other things, is inserted between a terminal for the supply voltage for the potentiometer and an OP amplifier, the voltage drop of which can be fed via an input to a microprocessor as a representative signal for the current flowing via the parallel connection from the potentiometer and an adjusting resistor.

The two last-mentioned solutions deal with calculating the influence of the contact resistance of the potentiometer in an adjustment range within the boundaries of the substrate, that is, by recognizing when it is too big.

SUMMARY OF THE INVENTION

It is therefore an object of the present invention to provide a means for suppressing misinformation generated when a slider moves, that is, pauses, at ends of a substrate.

In an embodiment of the invention, the contact resistance is substantially constantly compared to the measured values in the loaded and unloaded state during an adjustment of a potentiometer slider by alternately connecting a load resistor (laboratory resistor) to the slider of a potentiometer. An increase in the contact resistance can thus be attributed to a critical transition point. The measuring can be done in cycles. A large registered contact resistance thus determines an error, that is, the slider is located in the "dead" rotational area.

This can be easily done from a circuitry perspective, for example, by connecting a pull-up resistor, that is, a push/pull step via the I/O port of a microprocessor, which is electrically connected with the load resistor and the slider. The characteristic of the pull-up resistor is such that when no error is present, that is, the input of the microprocessor is on a "high" setting, and is pulled down to a "low" setting when an error occurs, which is diagnosed by the microprocessor as an error message. In this way, the system, in which the potentiometer is used as an adjustment component, is signaled that no defined state is set at the present time and thus, the system is not to set a state. A microprocessor already present in the system can be utilized for this purpose.

This solution allows a one hundred percent diagnosis of the potentiometer across the entire adjustment range.

Potentiometers of this type can be, among other things, single-turn rotating actuators for air distributions in heating/air-conditioning devices. Furthermore, these single-turn potentiometers can be used as increment setters.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
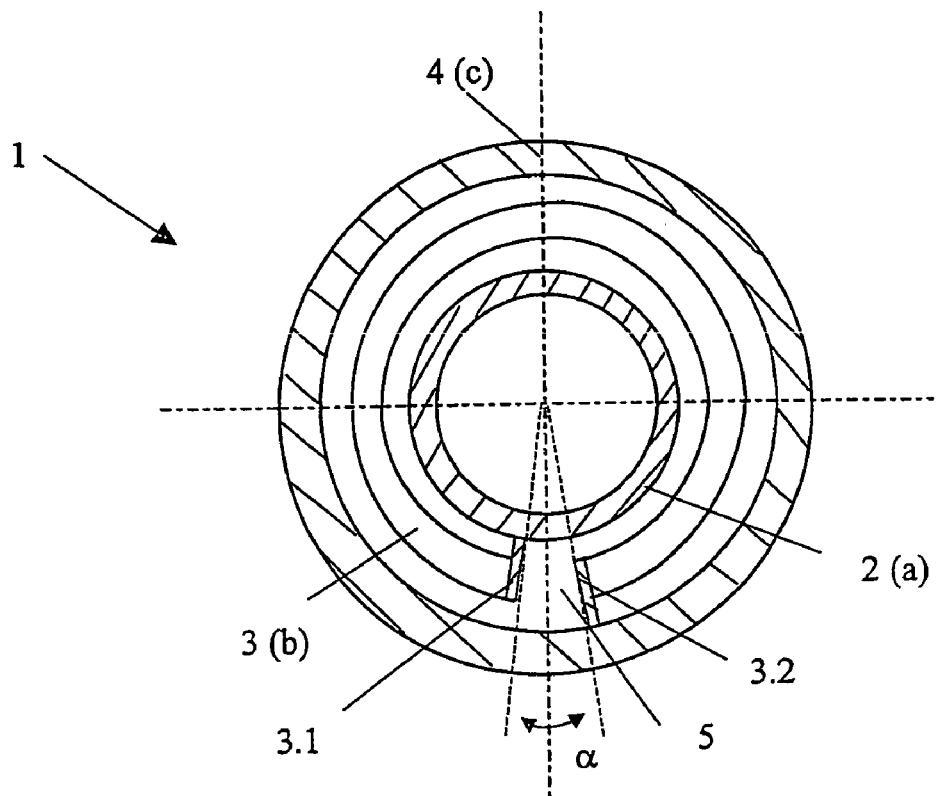
FIG. 1 is a conventional laminated plate.

FIG. 1 is a top view of a known conventional laminated plate 1 of a potentiometer 10 (not shown). In this embodiment, the laminated plate 1 includes tracks 2, 3, 4 (two supply tracks 2, 4, one resistance track 3), which, together with three contact sliders (not shown) form the potentiometer 11. Preferably, the slider contact points (a, b, c) of the individual tracks 2, 3, 4 are arranged on the laminated plate 1 at a 120 degree offset to one another. The resistance track 3 has a beginning 3.1 and an end 3.2. Between the two is a so-called dead angle α, which has the reference numeral 5, and in the present embodiment can be up to 8 degrees. This area 5 is characterized by indefinable voltages when the signal is picked up from the slider contact 6 (not shown) of the potentiometer 11.

Figure 2:
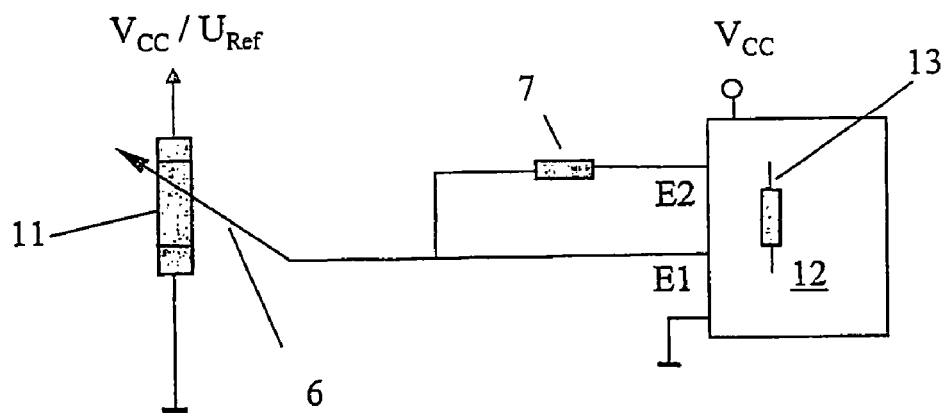
FIG. 2 is an illustration of the circuitry according to an embodiment of the present invention.

FIG. 2 illustrates a detail of a circuit including a precision resistor 7 at the slider 6, that is, the slider contact point, which is connected to an input E2 (output, tri-state) of a microprocessor 12. The slider contact point 6 itself is connected to the input E1 (input, analog) of the microprocessor 12. For the contact resistance $R_ü$ between the slider contact point 6 and the track 3, a control value for a loaded and/or unloaded state is obtained and stored in the microprocessor 12 as reference values.

In a functional application of the potentiometer 10, the contact resistance $R_ü$ is measured and periodically compared to the nominal value in the microprocessor 12. In the present embodiment, if this contact resistance $R_ü$ is higher than the control value, the input E1 of the microprocessor 12 is set to "low" by a pull-up resistor 13, which in interaction with the software of the microprocessor 12, is diagnosed as an error. In this way, a short-term increase of the contact resistance $R_ü$ is diagnosed as having reached the critical transition area 5 and thus, an activity actuation in the system is avoided.

As a matter of principle, a pull-down and a pull-up measurement is done to obtain data from both substrate ends 3.1, 3.2.

In addition, the application of a supply voltage $V_{cc}$ in the system and the presence of mass GRN can be checked with this circuitry. This allows a precise diagnosis of the entire adjustment range.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A diagnostic circuit for a potentiometer, the diagnostic circuit comprising:
    a laminated plate;
    at least one supply track;
    at least one resistance track, which has a track beginning and a track end, whereby located between the track beginning and the track end is a transition area, over which a contact slider of the potentiometer moves;
    a microprocessor having a first input that is connected to the contact slider of the potentiometer; and
    a resistor that is electrically connected to the contact slider of the potentiometer and that is directly electrically connected to a second input of the microprocessor,
    wherein a contact resistance that is present at the slider during adjustment of the slider is measured in a cyclical measurement step and compared in the microprocessor with stored control values, and
    wherein, during the measurement step, the contact resistance is measured by the microprocessor in an unloaded state, in a loaded state with a supply voltage, and against a ground.

2. The diagnostic circuit according to claim 1, wherein, via an increase of the contact resistance at the slider, the transition area is defined.

3. The diagnostic circuit according to claim 1, wherein the resistor is directly connected to the contact slider.

4. The diagnostic circuit according to claim 1, wherein the contact slider is directly connected to the first input of the microprocessor.

5. The diagnostic circuit according to claim 1, wherein the cyclical measurement step is performed continuously.

6. The diagnostic circuit according to claim 1, wherein the microprocessor comprises a pull-up resistor.

7. A diagnostic circuit for a potentiometer, the diagnostic circuit comprising:
    a laminated plate;
    at least one supply track;
    at least one resistance track, which has a track beginning and a track end, whereby located between the track beginning and the track end is a transition area, over which a contact slider of the potentiometer moves;
    a microprocessor having a first input, a second input, and stored control values, wherein the first input is connected to the contact slider of the potentiometer; and
    a resistor that is electrically connected to the contact slider of the potentiometer and that is directly electrically connected to the second input of the microprocessor,
    wherein the microprocessor is configured to compare the stored control values to a contact resistance that is present at the slider during adjustment of the slider and which is measured in a cyclical measurement step, and
    wherein the microprocessor is configured to measure the contact resistance during the cyclical measurement step in an unloaded state, in a loaded state with a supply voltage, and against a ground.

8. The diagnostic circuit according to claim 7, wherein the microprocessor comprises a pull-up resistor.

* * * * *